United States Patent
D'Anna et al.

(10) Patent No.: US 6,762,456 B1
(45) Date of Patent: Jul. 13, 2004

(54) MULTIPLE CONDUCTIVE PLUG STRUCTURE INCLUDING AT LEAST ONE CONDUCTIVE PLUG REGION AND AT LEAST ONE BETWEEN-CONDUCTIVE-PLUG REGION FOR LATERAL RF MOS DEVICES

(75) Inventors: Pablo D'Anna, Redding, CA (US); Alan Lai-Wai Yan, Belmont, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 0 days.

(21) Appl. No.: 10/360,365

(22) Filed: Feb. 8, 2003

Related U.S. Application Data

(62) Division of application No. 10/033,839, filed on Dec. 26, 2001, now Pat. No. 6,686,627.

(51) Int. Cl.[7] .......................... H01L 29/76; H01L 23/58
(52) U.S. Cl. ................. 257/335; 257/336; 257/339; 257/343; 257/344; 257/408; 257/491; 257/492; 257/493; 257/494
(58) Field of Search ................... 257/335, 336, 257/339, 334, 343, 408, 491, 492–494

(56) References Cited

U.S. PATENT DOCUMENTS 4,890,146 A * 12/1989 Williams et al. ............ 257/336
5,841,166 A    11/1998 D'Anna et al.

* cited by examiner

Primary Examiner—Kang Donghee
(74) Attorney, Agent, or Firm—Boris G. Tankhilevich

(57) ABSTRACT

A lateral RF MOS transistor with at least one conductive plug structure comprising: (1) a semiconductor material of a first conductivity type having a first dopant concentration and a top surface; (2) a conductive gate overlying and insulated from the top surface of the semiconductor material; (3) at least two enhanced drain drift regions of the second conductivity type of the RF MOS transistor; the first region laying partially underneath the gate; the second enhanced drain drift region contacting the first enhanced drain drift region, the dopant concentration of the second enhanced drain drift region is higher than the dopant concentration of the first enhanced drain drift region; (4) a drain region of the second conductivity type contacting the second enhanced drain drift region; (5) a body region of said RF MOS transistor of the first conductivity type with the dopant concentration being at least equal to the dopant concentration of the semiconductor epi layer; (6) a source region of the second conductivity type located within the body region; (7) a body contact region of the first conductivity type contacting the body region; and (8) a plug region further comprising at least one conductive plug region, and at least one between-conductive-plug region.

34 Claims, 3 Drawing Sheets

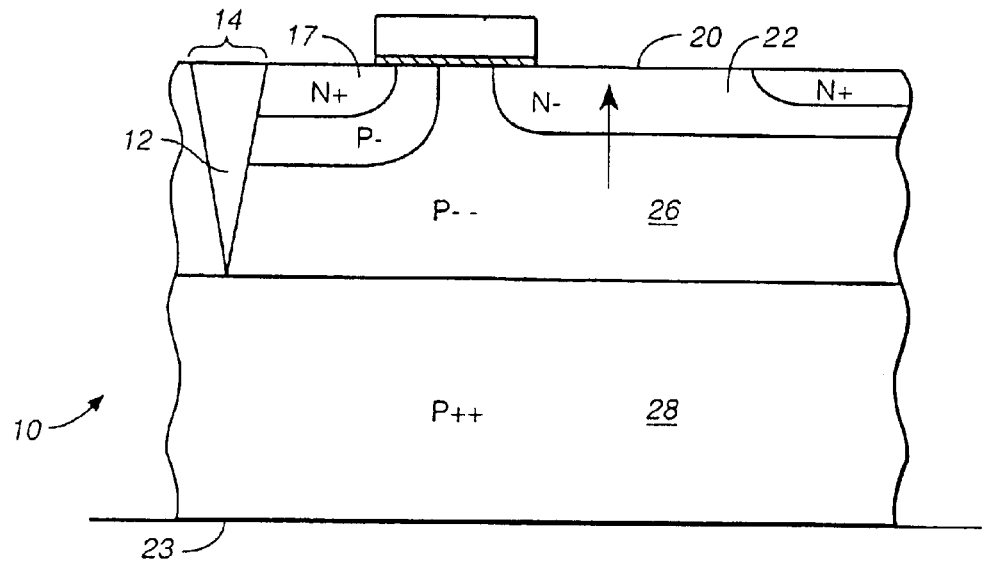
FIG._1A (PRIOR ART)
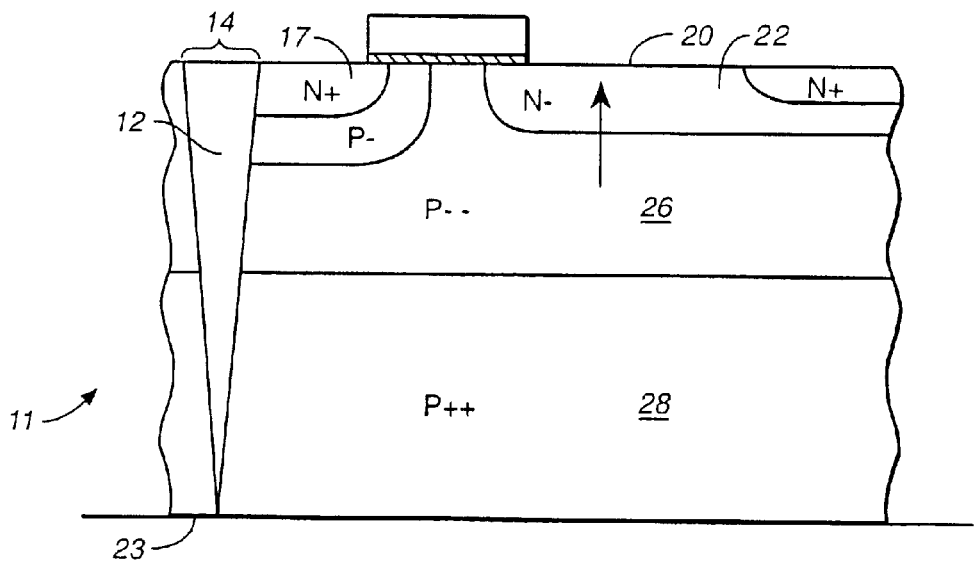
FIG._1B (PRIOR ART)

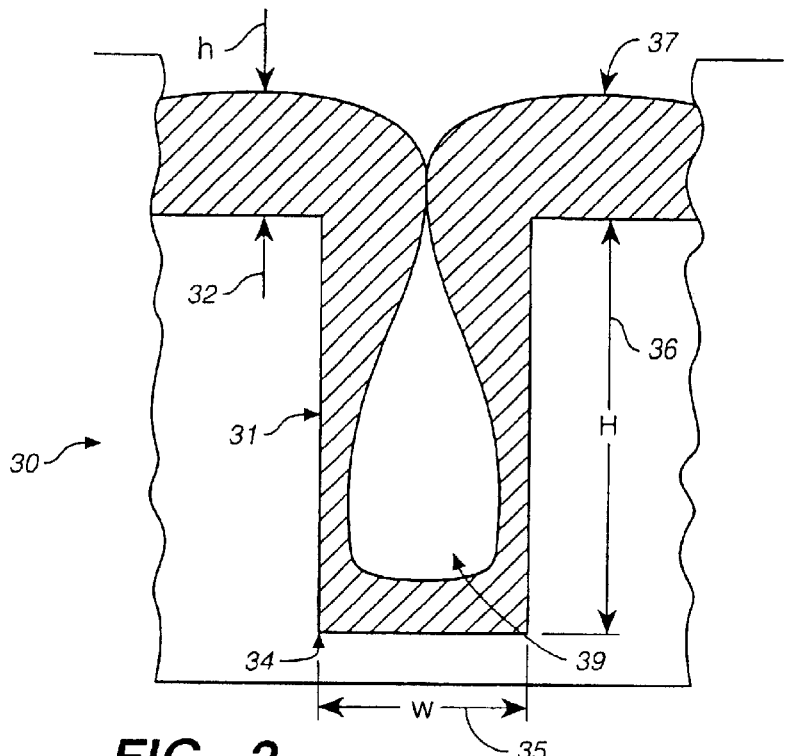
FIG._2
(PRIOR ART)
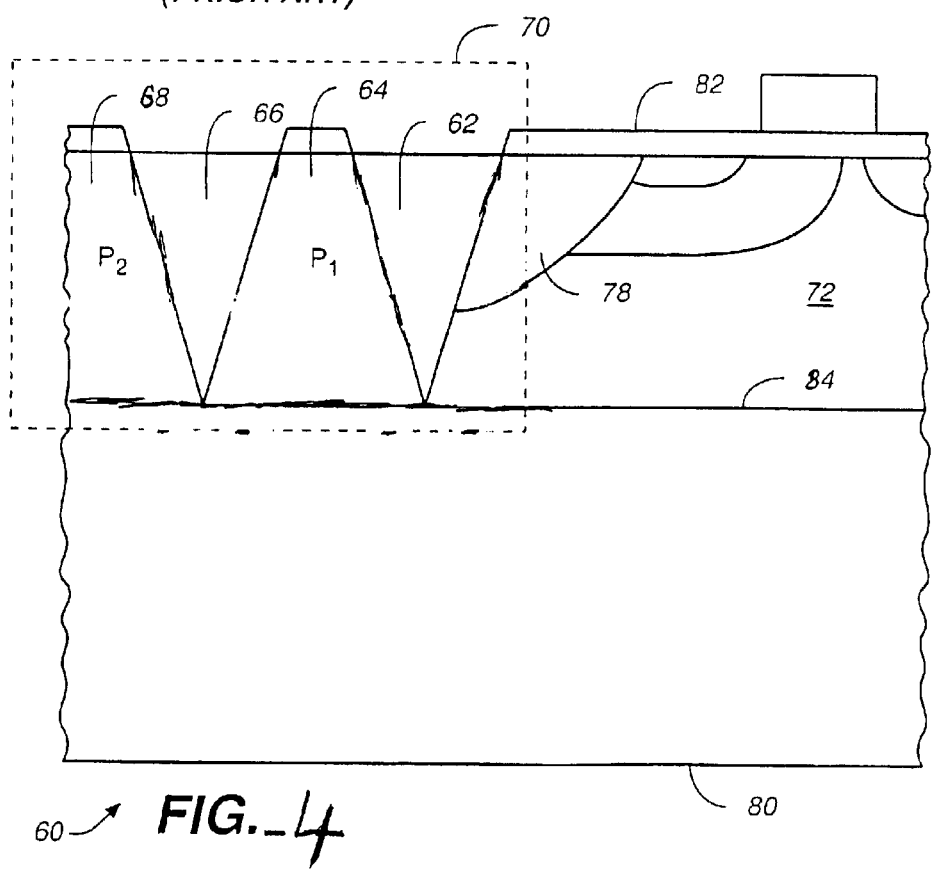
FIG._4

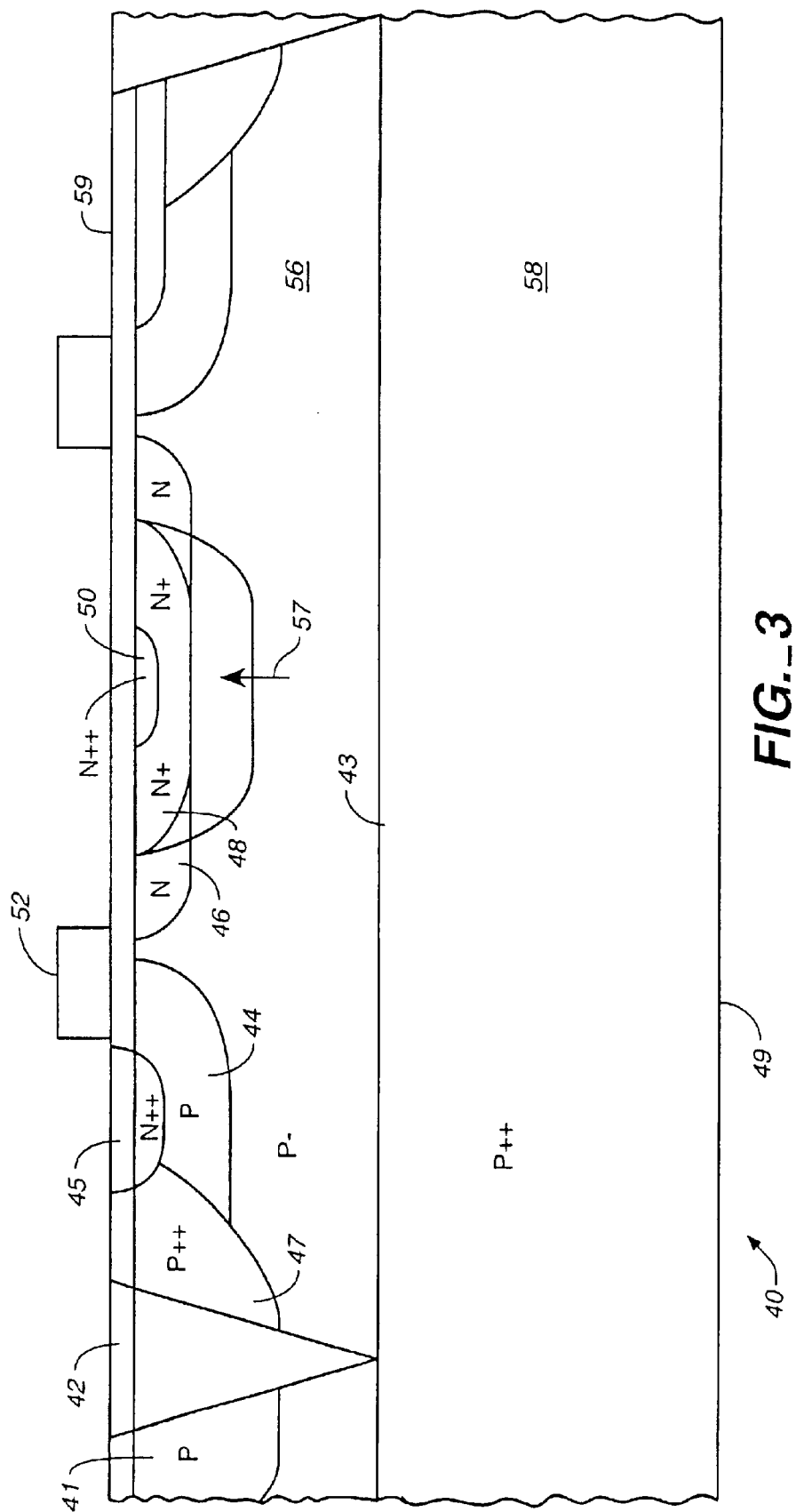
FIG._3

MULTIPLE CONDUCTIVE PLUG STRUCTURE INCLUDING AT LEAST ONE CONDUCTIVE PLUG REGION AND AT LEAST ONE BETWEEN-CONDUCTIVE-PLUG REGION FOR LATERAL RF MOS DEVICES

This is a divisional patent application for the U.S. patent application Ser. No. 10/033,839, filed Dec. 26, 2001, now U.S. Pat. No. 6,686,627, issued Feb. 3, 2004 and "MULTIPLE CONDUCTIVE PLUG STRUCTURE FOR LATERAL RF MOS DEVICES."

BACKGROUND OF THE INVENTION

1. Field of the Invention

The present invention is in the field of lateral RF MOS devices. More specifically, the present invention relates to a lateral MOS structure utilized to build an RF MOS device with an improved hot carrier reliability and improved RF performance.

2. Discussion of the Prior Art

An LDMOS technology is rapidly becoming the technology of choice for RF power amplification in wireless communication applications. There has been a continuous effort to further improve the device performance based on RF LDMOS technology, including optimization in layout and reduction in the gate resistance. However, the device performance remains limited by the large parasitic feedback capacitance $C_{rss}$ because the RF output power decreases drastically with the increased parasitic feedback capacitance $C_{rss}$, and parasitic source resistance and inductance. Thus, the reduction of the parasitic feedback capacitance $C_{rss}$, and parasitic source resistance and inductance are crucial to an RF LDMOS device performance.

Another issue is the hot-carrier effects that degrade the performance of an LDMOS device used as an RF power amplifier. Indeed, in such a device, gate and drain may be biased with a high voltage simultaneously. Therefore, the LDMOS device might be forced to operate at high electric field while carrying high current. However, due to the hot-electron injection into the gate oxide, threshold voltage and transconductance change result in the decrease of drain current-carrying capability. Thus, hot-electron effects cause the device gain to decrease and $R_{Drain-Source}$ to increase thus resulting in output power degradation.

A number of structures have been proposed in the past years regarding improvements to the performance of LDMOS devices used in RF amplification for wireless applications. All these prior art structures had in common the mininization of parasitic source resistance and inductance, the increase of drain-source breakdown voltage, the maximization of drain current, and the reduction of hot electron carrier effects.

For instance, in the paper "RF LDMOS with Extreme Low Parasitic Feedback Capacitance and High Hot-Carrier Immunity" given by Shuming Xu, Pangdow Foo, Jianqing Wen, Yong Liu, Fujiang Lin, and Changhong Ren at the International Electron Devices Meeting in Washington, D.C., Dec. 5–8, 1999, a new RF LDMOS was demonstrated with a cost effective process technology. By combining a step LDD and an inherent thermal oxide spacer, the parasitic feedback capacitance was reduced by 40%, achieving a 35% higher output power. The hot-electron resistance was also improved by 70%, allowing power to be obtained with a higher reliability.

However, this approach entails the control of the lateral oxidation of the polysilicon gate finger which is difficult to achieve. A simpler approach is to optimize the depth and concentration of the enhanced drain structures in order to maximize the drain-source breakdown voltage, and to minimize the hot electron effects.

An LDMOS device structure with a plug formed on a partially filled trench has another drawback. Indeed, such a structure does not allow one to substantially planarize the LDMOS device structure. This issue is important because a planarized LDMOS structure can be used to increase the degree of freedom in designing an RF LDMOS amplifier device with the required characteristics. For instance, the substantially planarized LDMOS structure can be used to design an RF LDMOS high power amplifier device with an improved RF gain, improved collector efficiency, and a wider usable bandwidth (BW) as compared with an RF LDMOS devices designed by using a conventional non-planarized LDMOS structure.

What is needed is a substantially filled multiple conductive plug LDMOS structure with a reduced hot carrier vulnerability that would allow one to design an RF LDMOS device with an improved RF performance.

SUMMARY OF THE INVENTION

To address the shortcomings of the available art, the present invention provides a substantially planarized multiple conductive plug LDMOS structure with a multiple enhanced drain drift region. The LDMOS structure of the present invention allows one design an RF LDMOS power amplifier for wireless applications with substantially improved RF performance because of significantly reduced hot carrier vulnerability and improved drain-source breakdown voltage.

One aspect of the present invention is directed to a lateral RF MOS transistor with at least one conductive plug structure.

In one embodiment of the present invention, the lateral RF MOS transistor with at least one conductive plug structure comprises: (a) a semiconductor material of the first, P conductivity type, or an epi layer, having a first (epi layer) dopant concentration and a top surface; (b) a conductive gate overlying the top surface of the epi layer and insulated from the epi layer by silicon dioxide; (c) a first enhanced drain drift region of the second, N conductivity type, having a second dopant concentration, formed in the epi layer and extended at a first depth level inside the epi layer; (d) a second enhanced drain drift region of N conductivity type, having a third dopant concentration, formed in the epi layer and extended at a second depth level inside the epi layer; (e) a drain region of N conductivity type, having a drain dopant concentration and formed in the epi layer; (f) a body region of P conductivity type, having a body region dopant concentration, including a first end underlying the conductive gate, formed in the epi layer; (g) a source region of N conductivity type formed in the epi layer, having a source region dopant concentration, located within the body region; (h) a body contact region of P conductivity type, having a body contact region dopant concentration, contacting the body region; and (I) a plug region. In one embodiment, the drain region contacts the second enhanced drain drift region, and the second enhanced drain drift region contacts the first enhanced drain drift region.

In one embodiment of the present invention, the plug region further comprises at least one conductive plug region formed in the epi layer, and at least one between-conductive-plug region of the first, P conductivity type, having a between-conductive-plug dopant concentration formed in the epi layer. The conductive plug region contacts the body contact region of the epi layer, and the between-conductive-plug region contacts the conductive plug region.

In one embodiment of the present invention, the plug region further comprises two conductive plug regions formed in the epi layer, and at least one between-conductive-plug region of P conductivity type formed in the epi layer and located between two conductive plug regions. The first conductive plug region contacts the body contact region of the epi layer.

In one embodiment, both the first conductive plug region and the second conductive plug region connect the body contact region of the epi layer to a highly conductive substrate of the structure.

In one embodiment of the present invention, the dopant concentration of the second enhanced drain drift region is higher than the dopant concentration of the first enhanced drain drift region, and the drain region dopant concentration is higher than the dopant concentration of the second enhanced drain drift region. In one embodiment of the present invention, the body region dopant concentration is at least equal to the dopant concentration of the epi layer, and the body contact region dopant concentration is greater than the body region dopant concentration.

In one embodiment of the present invention, the first (and/or the second) conductive plug comprises: a metal plug, a silicided plug, a tungsten silicide plug, a titanium silicide plug, a cobalt silicide plug, and/or a platinum silicide plug.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 1A depicts a prior art lateral MOS structure having a "narrow" trench filled with a single conductive plug connecting the source region at the chip surface to the backside.

FIG. 1B illustrates a prior art lateral MOS structure having a "narrow" trench filled with a single conductive plug connecting the source region at the chip surface to the substrate.

FIG. 2 shows the "narrow" trench of the prior art lateral MOS in more details.

FIG. 3 illustrates a lateral RF MOS device of the present invention including a plug region including one conductive plug region connecting the body contact region and the substrate, and one between-conductive-plug region.

FIG. 4 shows a lateral RF MOS device of the present invention including a plug region including two conductive plug regions and two between-conductive-plug regions.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present application incorporates in its entirety the U.S. Pat. No. 5,949,104 "Source Connection Structure for Lateral RF MOS devices". As depicted in FIG. 1A, the '104 patent discloses a lateral MOS structure 10 having a single plug 12 connecting the source region 17 at the chip surface 20 to its substrate 28 (in another embodiment of '104 patent). As was stated in '104 patent, the single lateral MOS plug structure allows one to obtain an increase in the packing density of the RF MOS device active areas per unit chip area, a reduction in the output capacitance of the RF MOS device, and an improvement in usable BW of the RF MOS device employed in amplifier circuits.

However, the lateral MOS structure of '104 patent has some drawbacks related to the size and depth of the trench and the process used to deposit the metal layer to fill it. Indeed, as shown in FIG. 2, if a sputtering process is used to deposit the metal into the trench 31, the width (W) 35 of the trench 31 is greater than 3 microns and its depth (H) 36 is less than 6 microns, the metal sputtered thickness (h) 32 needs to be equal to the depth (H) to totally fill the trench. The planarization of the structure with such thick metal layer (greater than 6 microns) by subsequent processes becomes very difficult. If the trench 31 has a width (W) less than (2–3) microns, for the same depth (H) situation, the shadowing effect of the sputtering process will build a metal ledge 37 at the side surface of the trench that prevents the complete trench filling by creating a hole 39 inside the plug.

If, on the other hand, the chemical vapor deposit (CVD) and etch back process is performed in order to fill the trench cavity 34 with metal, one can fill completely only a "narrow" trench 34 with a width W, wherein there is a certain relationship between the width of the "narrow" trench cavity W 35 that can be completely filled with metal, and the depth H of the trench 36. In the present technology, this relationship between the width of the "narrow" trench W and the size H of the trench can be expressed as follows:

$$W < H/2. \tag{1}$$

However, the current etch process technology can remove only up to $1.00\mu$ layer of metal from the surface. Thus, the single "narrow" trench having the width only up to $2.0\mu$ can be completely filled with metal.

But, there is a long felt need in the field of power RF amplifiers for wireless applications for a lateral LDMOS structure with a trench completely filled with metal, so that the device built on such a structure would have a substantially high source conductivity to demonstrate superior RF performance. For instance, one would need a lateral RF MOS transistor with a "wide" trench, preferably up to $6\mu$, completely filled with metal, in order to have enough conductivity to substantially decrease the large parasitic source resistance and inductance. The "wide" trench structure can be modeled by using a multiple plug structure approach. Thus, a multiple plug lateral LDMOS structure would allow one to minimize the parasitic source resistance and inductance using the same processing technology as in the case of single plug lateral LDMOS structure, and to design an RF LDMOS power amplifier for wireless applications with substantially improved RF performance.

The single plug lateral MOS structure of '104 patent has another drawback- it includes only one enhanced drain drift region 22 (of FIGS. 1A and 1B) which leads to a low drain-source breakdown voltage and high hot carrier drift effects because of the relatively high electric fields next to the gate-drain junction.

To support a high drain-source breakdown voltage (greater than 70 Volt), the U.S. Pat. No. 6,271,552 "Lateral RF MOS device with improved Breakdown voltage" discloses a large power output lateral RF MOS structure having two enhanced drain drift regions. The existence of two enhanced drain drift regions allows one to significantly increase the maximum drain-source voltage breakdown thus reducing the hot-carrier vulnerability of the device built on the '552 LDMOS technology. The '552 patent is incorporated herein in its entirety.

FIG. 3 depicts an LDMOS structure of the present invention 40 that includes at least one plug region 42, that is used to connect the body contact region 47 of the LDMOS device to the substrate 58, and at least one between-conductive-plug region 41. The LDMOS structure of the present invention 40 also includes at least two drain drift regions 46 and 48 that allows one to increase the threshold voltage thus significantly reducing hot-carrier vulnerability (as fully explained below). Therefore, the present invention RF LDMOS technology allows one to build an RF LDMOS power amplifier for wireless applications with substantially improved RF performance and significantly reduced hot-carrier vulnerability. Additionally, the drain extension region concentration is designed to have the lowest doping concentration N in the first drain drift region 46, closest to the gate 52, with the doping concentration N+ of the remaining portion of the drain extension area (the second drain drift region 48) increasing towards the drain region 50.

The source plugs 42 are placed within the device structure, between the channel regions. The RF LDMOS structure 40 of present invention has the capability of optimizing performance over other approaches by the selection of how many plugs and/or drain extension areas to use for the desired application.

In one prior art structure, disclosed in U.S. Pat. No. 5,155,563 (issued to Motorola), a connection of the source and body regions in the MOS structure to the backside is made through the diffusion of a dopant introduced from the topside of the chip and a metal finger short. However, this diffusion not only moves the topside dopant down and sideways but also moves the substrate dopant up thus reducing the distance between the highly doped substrate interface and the drain area of the device. This diffusion movement of the interface produces an increase of the minimum source-drain capacitance $C_{ds}$ that can be obtained under a high voltage bias $V_{DS}$.

In another prior art structure disclosed in the U.S. Pat. No. 5,841,166 (issued to Spectrian), the connection between the source and body regions in the MOS structure to backside was made by a sinker contact aligned with the source region and spaced from the width of the channel region.

On the other hand, FIGS. 1A and 1B illustrate a prior art single LDMOS plug structure 10 disclosed in the U.S. Pat. No. 5,949,104. The plug 12 connects the source 17 and the body areas (not marked) to the backside 23 through the original epitaxial layer 26 thickness without diffusion. The connection area 14 could be made small comparable to the prior art diffusion area of the '563 patent, thus increasing the density of devices per inch$^2$.

The usage of a metal plug 12 of FIG. 1A (and FIG. 1B) takes care of two important prior art technological problems: (1) how to make a good ohmic contact in a small area (2) without long thermal processing cycles. As it is well known in the art, the long thermal processing cycles increase the doping movements thus increasing the source-drain capacitance $C_{ds}$.

The prior art lateral RF MOS plug structure 12 (of FIGS. 1A and 1B) was optimized for high frequency applications, such as the cellular and the PCS regions of the RF spectrum in terms of its transconductance $g_m$ and the interelectrode capacitances $C_{gs}$, $C_{gd}$, and $C_{ds}$. The transconductance per unit $g_m$ was increased by fabricating the device with the smallest plug size that the technology would allow. The reduction of the interelectrode capacitance (mainly $C_{gd}$ and $C_{ds}$) affects gain and efficiency. The gate-drain capacitance $C_{gd}$ and the source-drain capacitance $C_{ds}$ are proportional to the gate and drain region areas (including sidewalls). Therefore, the reduction in $C_{gd}$ capacitance was obtained by minimizing the channel length L and by minimizing the insertion of the drain extension lateral diffusion under the gate. The reduction in $C_{ds}$ capacitance was obtained by utilizing a high resistivity material under the drain portion of the structure and by separating the drain area from the source. A conductive plug region 12 (of FIGS. 1A and 1B) was formed in the source-body region of the semiconductor material 26.

Referring still to FIG. 3, this is a detailed cross-sectional view of the lateral RF MOS transistor 40 of the present invention having at least one conductive plug region 42, at least one between-conductive-plug-region 41 having a first conductivity type and having a first between-conductive-plug dopant concentration, and at least two drain drift regions 46 and 48. The device structure 40 comprises: a semiconductor material comprising an epitaxial layer 56 of a first conductivity type and having an epitaxial layer dopant concentration and a top surface 59.

In one embodiment, the epitaxial layer's conductivity type is of P-type, that is the majority carriers are holes. The dopant concentration of the epitaxial layer is P$^-$, wherein (−) indicates that the dopant concentration of holes P$^-$ in the epitaxial layer 56 is small comparatively with the hole concentration P in the body region 44 (see discussion below). The typical thickness of the epitaxial layer 56 is (3–10)$\mu$. In this embodiment, the between-conductive-plug region 41 is of the first conductivity type P and includes between-conductive-plug dopant concentration P.

In another embodiment of the present invention, the semiconductor material 56 is of a second (N) conductivity type, has a dopant concentration N$^-$ and includes a top surface 59. In this embodiment, the between-conductive-plug region 41 is of the second conductivity type N and includes between-conductive-plug dopant concentration N. In this embodiment, the majority carriers are electrons.

A conductive gate 52 overlies a portion of the top surface 59 of the semiconductor material. The gate 52 is insulated from the semiconductor material by a gate oxide layer 54. The gate oxide layer 54 has dimensions (200–700) Å. In one embodiment, the gate 52 comprises a polysilicon gate.

Referring still to FIG. 3, the region 46 forms a first enhanced drain drift region of the RF MOS structure. The region 46 is formed completely within the semiconductor material 56. In one embodiment, the first enhanced drain drift region 46 has N conductivity type if the epitaxial layer 56 has P conductivity type. In an alternative embodiment, the first enhanced drain drift region 46 has P conductivity type if the epitaxial layer has N conductivity type.

In one embodiment, the first enhanced drain drift region 46 has N conductivity type and has a dopant concentration $N_1$. The first enhanced drain region 46 has dimensions (0.1–2.5)$\mu$ laterally, and about (0.2–0.5)$\mu$ vertically.

In one embodiment, the region 48 forms a second enhanced drain drift region of the RF MOS structure that contacts the first enhanced drain drift region 46. The region 48 is formed completely within the semiconductor material 56. In one embodiment, the second enhanced drain drift region 48 has N conductivity type if the epitaxial layer has P conductivity type. In another embodiment, the second enhanced drain drift region 48 has P conductivity type if the epitaxial layer has N conductivity type.

In one embodiment, the second enhanced drain drift region 48 has N conductivity type and has a dopant concentration $N_2$ that is larger than the dopant concentration $N_1$ of the first enhanced drain region 46:

$$N_1 < N_2. \tag{2}$$

In one embodiment, the dopant concentration $N_2$ of the second enhanced drain drift region 48 is 3/2 as much as the dopant concentration $N_1$ of the first enhanced drain drift region 46:

$$N_2 = 3/2 N_1. \tag{3}$$

The structure of the lateral RF MOS device 40 (of FIG. 3) of the present invention including two drain drift regions (46 and 48) allows one to increase the maximum drain drift current density of the device and the drain-to-source breakdown voltage $V_{breakdown}$ of the structure 40 (of FIG. 3) is also increased. Indeed, the effective electrical field in the drain drift region is strong enough (about 10 kV/cm) to cause at certain critical concentration of carriers $N_c$ the avalanche effect of carrier multiplication. Thus, the critical carrier concentration $N_c$ is related to the breakdown voltage $V_{breakdown}$, that is defined as the voltage at which the avalanche effect of carrier multiplication takes place.

According to (eq. 2), the second drain drift region 48 has the concentration $N_2$ that is higher than the concentration of the first drain drift region $N_1$. This results in the redistribution of the critical electrical fields in the source-drain channel and in an increase of the drain-to-source breakdown voltage $V_{breakdown}$. The maximum current density in the source-drain channel of the device is also increased because the total concentration:

$$N_T = N_1 + N_2 \tag{4}$$

in both drain enhancement regions reduces the resistance of the drain region.

In one embodiment, as shown in FIG. 3, the second enhanced drain drift region 48 is extended into the semiconductor material 56 at the same depth level as the first enhanced drain drift region 46. In another embodiment, the second enhanced drain drift region 57 is extended into the semiconductor material 56 deeper than the first drain enhanced drift region 46.

Referring still to the structure 40 of FIG. 3 of the RF MOS device of the present invention, a drain region 50 is also formed in the epitaxial layer 56. In one embodiment, the drain region 50 has the N conductivity type, if the epitaxial layer 56 has P conductivity type. In another embodiment, the drain region 50 has the P conductivity type, if the epitaxial layer 56 has N conductivity type. If the drain region 50 is of N conductivity type, the drain region 50 has a dopant concentration $N_{drain}$ that is greater than the dopant concentration $N_2$ of the second drain drift region 48:

$$N_{drain} > N_2 > N_1. \tag{5}$$

The drain region 50 contacts the second enhanced drain drift region 48. The typical dimensions of the drain region 50 are (0.5–3.0)$\mu$ horizontally, and (0.1–0.3)$\mu$ vertically.

Referring still to FIG. 3, a body region 44 of the RF MOS structure (40 of FIG. 3) is also formed in the epi layer 56. In one embodiment, the body region 44 has P conductivity type if the epitaxial layer 56 has P conductivity type. In another embodiment, the body region 44 has N conductivity type if the epitaxial layer 56 has N conductivity type.

In the P conductivity type embodiment, the body region 44 has a dopant concentration P that is at least equal to the dopant concentration $P^-$ of the epitaxial layer 56. The typical dimensions of the body region 44 are (0.5–1.5)$\mu$ horizontally or vertically.

The body region 44 includes a source region 45 being of N conductivity type N (if the epitaxial layer has P conductivity type and vice versa) and having a dopant concentration $N^{++}$. The typical dimensions of the source region 45 are (0.5–5.0)$\mu$ horizontally.

Referring still to FIG. 3, the body region 44 also includes a body contact region 47 being of P conductivity type (if the epitaxial layer has P conductivity type and vice versa) and having a dopant concentration $P^{++}$ that is greater than the dopant concentration P of the body region 44. The typical dimensions of the body contact region 47 are (0.5–3.0)$\mu$ vertically or horizontally.

In one embodiment of the present invention, the substrate 58 is a highly conductive one and is P-doped with concentration of carriers (0.005–0.01)$\Omega$-cm.

In one embodiment of the present invention, as depicted in FIG. 4, the plug region 70 comprises at least two conductive plug regions: a first conductive plug region 62 formed in the epi layer 172, and a second conductive plug region 66 formed in the epi layer 72. The first conductive plug region 62 contacts the body contact region 78.

In one embodiment, the plug region 70 of FIG. 4 further comprises a first between-conductive-plug region 64 formed in the epi layer 72. In one embodiment, the first between-conductive-plug region is of the first conductivity type P and includes a first between-conductive-plug dopant concentration $P_1$. The first between-conductive-plug region 64 contacts the first conductive plug region 62. The second conductive plug region 66 contacts the first between-conductive-plug region 64.

In one embodiment, the plug region 70 of FIG. 4 further comprises a second between-conductive-plug region 68 formed in the epi layer 72. In one embodiment, the second between-conductive-plug region 68 is of the first conductivity type P and has a second between-conductive-plug dopant concentration $P_2$. The second between-conductive-plug region contacts the second conductive plug region 66.

Referring still to FIG. 4, in one embodiment of the present invention, the first conductive plug region 62 connects the body contact region 78 of the epi layer 72 to a highly conductive substrate 84 of the structure, and the second conductive plug region 66 connects a top surface 82 of the epi layer 72 to the substrate 84.

The conductive plug (42 of FIG. 3, and/or 62 of FIG. 4, and/or 66 of FIG. 4) comprises a metal plug or a silicided plug. The silicided plug comprises a tungsten silicide plug, a titanium silicide plug, a cobalt silicide plug, or a platinum silicide plug.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claim's appended hereto and their equivalents.

What is claimed is:

1. A lateral RF MOS transistor with at least one conductive plug structure comprising:

a semiconductor material of a first conductivity type, said semiconductor material having a first dopant concentration and a top surface;

a conductive gate overlying a portion of and insulated from the to surface of said semiconductor material;

a first region formed completely within said semiconductor material to a first depth level, said first region being of a second conductivity type, and having a second dopant concentration to form a first enhanced drain drift region of said RF MOS transistor;

a second region formed in said semiconductor material to a second depth level, said second region being of said second conductivity type and having a third dopant concentration to form a second enhanced drain drift region of said RF MOS transistor, said second region contacting said first region, said third dopant concentration being higher than said second dopant concentration;

a third region formed in said semiconductor material, said third region being of said second conductivity type and having a fourth dopant concentration greater than said third dopant concentration to form a drain region of said RF MOS transistor, said third region contacting said second region;

a fourth region formed in said semiconductor material, said fourth region being of said first conductivity type and having a fifth dopant concentration to form a body region of said RF MOS transistor, said fifth dopant concentration being at least equal to said first dopant concentration, said fourth region having a first end underlying said conductive gate, any remaining portion of said semiconductor material underlying said gate being of said first conductivity type;

a fifth region formed in said semiconductor material, said fifth region being of said second conductivity type and having a sixth dopant concentration to form a source region of said RH MOS transistor, said fifth region being located within said fourth region;

a sixth region formed in said semiconductor material, said sixth region being of said first conductivity type and having a seventh dopant concentration to form a body contact region of said RF MOS transistor, said seventh dopant concentration being greater than said fifth dopant concentration of said fourth region, said sixth region contacting said fourth region; and a plug region further comprising:

a first conductive plug region formed in said semiconductor material; said first conductive plug region contacting said body contact region of said semiconductor material;

a between-conductive-plug region formed in said semiconductor material, said between-conductive-plug region being of said first conductivity type and having a between-conductive-plug dopant concentration; said between-conductive-plug region contacting said first conductive plug region; and a second conductive plug region formed in said semiconductor material; said second conductive plug region contacting said between-conductive-plug region.

2. The lateral RF MOS transistor of claim 1;

wherein said first conductive plug region connects said body contact region of said semiconductor material to said highly conductive substrate of said transistor;

and wherein said second conductive plug region connects a top surface of said semiconductor material to said highly conductive substrate of said transistor.

3. The lateral RF MOS transistor of claim 1, wherein said first conductive plug comprises a metal plug.

4. The lateral RF MOS transistor of claim 1, wherein said second conductive plug comprises a metal plug.

5. The lateral RIP MOS transistor of claim 1, wherein said first conductive plug comprises a silicided plug.

6. The lateral RF MOS transistor of claim 5, wherein said first conductive plug comprises a tungsten silicide plug.

7. The lateral RF MOS transistor of claim 5, wherein said first conductive plug comprises a titanium silicide plug.

8. The lateral RF MOS transistor of claim 5, wherein said first conductive plug comprises a cobalt silicide plug.

9. The lateral RF MOS transistor of claim 5, wherein said first conductive plug comprises a platinum silicide plug.

10. The lateral RF MOS transistor of claim 1, wherein said second conductive plug comprises a silicided plug.

11. The lateral RIP MOS transistor of claim 10, wherein said second conductive plug comprises a tungsten silicide plug.

12. The lateral RF MOS transistor of claim 10, wherein said second conductive plug comprises a titanium silicide plug.

13. The lateral RF MOS transistor of claim 10, wherein said second conductive plug comprises a cobalt silicide plug.

14. The lateral RF MOS transistor of claim 10, wherein said second conductive plug comprises a platinum silicide plug.

15. The lateral RF MOS transistor of claim 1, wherein said first conductivity type is a P type.

16. The lateral RF MOS transistor of claim 1, said first enhanced drain drift region having said second dopant concentration extended at said first depth level, said second enhanced drain drift region having said third dopant concentration extended at said second depth level, and wherein said second drain drift region is extended into said semiconductor material deeper than said first drain drift region.

17. A lateral RF MOS transistor with at least one conductive plug structure comprising:

a semiconductor material of a first conductivity type said semiconductor material having a first dopant concentration and a top surface;

a conductive gate overlying a portion of and insulated from the top surface of said semiconductor material;

a first region formed completely within said semiconductor material to a first depth level, said first region being of a second conductivity type, and having a second dopant concentration to form a first enhanced drain drift region of said RF MOS transistor;

a second region formed in said semiconductor material to a second depth level, said second region being of said second conductivity type and having a third dopant concentration to form a second enhanced drain drift region of said RF MOS transistor, said second region contacting said first region, said third dopant concentration being higher than said second dopant concentration;

a third region formed in said semiconductor material said third region being of said second conductivity type and having a fourth dopant concentration greater than said third dopant concentration to form a drain region of said RF MOS transistor, said third region contacting said second region;

a fourth region formed in said semiconductor material said fourth region being of said first conductivity type and having a fifth dopant concentration to form a body region of said RF MOS transistor, said fifth dopant concentration being at least equal to said first dopant concentration, said fourth region having a first end underlying said conductive gate, any remaining portion of said semiconductor material underlying said gate being of said first conductivity type;

a fifth region formed in said semiconductor material, said fifth region being of said second conductivity type and having a sixth dopant concentration to form a source region of said RF MOS transistor, said fifth region being located within said fourth region;

a sixth region formed in said semiconductor material, said sixth region being of said first conductivity type and having a seventh dopant concentration to form a body contact region of said RF MOS transistor, said seventh dopant concentration being greater than said fifth dopant concentration of said fourth region, said sixth region contacting said fourth region; and a plug region further comprising:
   a first conductive plug region formed in said semiconductor material; said first conductive plug region contacting said body contact region of said semiconductor material;
   a first between-conductive-plug region formed in said semiconductor material, said first between-conductive-plug region being of said first conductivity type and having a first between-conductive-plug dopant concentration; said first between-conductive-plug region contacting said first conductive plug region;
   a second conductive plug region formed in said semiconductor material; said second conductive plug region contacting said first between-conductive-plug region; and
   a second between-conductive-plug region formed in said semiconductor material, said second between-conductive-plug region being of said first conductivity type and having a second between-conductive-plug dopant concentration; said second between-conductive-plug region contacting said second conductive plug region.

18. The lateral RF MOS transistor of claim 17, wherein said first conductive plug region connects said body contact region of said semiconductor material to said highly conductive substrate of said transistor; and wherein said second conductive plug region connects a top surface of said semiconductor material to said highly conductive substrate of said transistor.

19. The lateral RF MOS transistor of claim 17, wherein said first conductive plug comprises a metal plug.

20. The lateral RF MOS transistor of claim 17, wherein said second conductive plug comprises a metal plug.

21. The lateral RF MOS transistor of claim 17, wherein said first conductive plug comprises a silicided plug.

22. The lateral RF MOS transistor of claim 21, wherein said first conductive plug comprises a tungsten silicide plug.

23. The lateral RF MOS transistor of claim 21, wherein said first conductive plug comprises a titanium silicide plug.

24. The lateral RF MOS transistor of claim 21, wherein said first conductive plug comprises a cobalt silicide plug.

25. The lateral RF MOS transistor of claim 21, wherein said first conductive plug comprises a platinum suicide plug.

26. The lateral RF MOS transistor of claim 17, wherein said second conductive plug comprises a silicided plug.

27. The lateral RF MOS transistor of claim 26, wherein said second conductive plug comprises a tungsten silicide plug.

28. The lateral RF MOS transistor of claim 26, wherein said second conductive plug comprises a titanium silicide plug.

29. The lateral RF MOS transistor of claim 26, wherein said second conductive plug comprises a cobalt silicide plug.

30. The lateral RF MOS transistor of claim 26, wherein said second conductive plug comprises a platinum silicide plug.

31. The lateral RF MOS transistor of claim 17, wherein said first conductivity type is a P type.

32. The lateral RF MOS transistor of claim 17, said first enhanced drain drift region having said second dopant concentration extended at said first depth level, said second enhanced drain drift region having said third dopant concentration extended at said second depth level, and wherein said second drain drift region is extended into said semiconductor material deeper than said first drain drift region.

33. A semiconductor device, comprising:
   a semiconductor substrate of a first conductivity type and having a substrate dopant concentration;
   a semiconductor material overlying said substrate, said semiconductor material having a first conductivity type, said semiconductor material having a first dopant concentration and a top surface;
   a plurality of transistor disposed upon said top surface of said semiconductor material, at least some of said plurality of transistors having a lateral DMOS structure, including:
      a conductive gate overlying a portion of and insulated from the top surface of said semiconductor material;
      a first region formed completely within said semiconductor material to a first depth level, said first region being of a second conductivity type, and having a second dopant concentration to form a first enhanced drain drift region of said RF MOS transistor;
      a second region formed in said semiconductor material to a second depth level, said second region being of said second conductivity type and having a third dopant concentration to form a second enhanced drain drift region of said RF MOS transistor, said second region contacting said first region, said third dopant concentration being higher than said second dopant concentration;
      a third region formed in said semiconductor material, said third region being of said second conductivity type and having a fourth dopant concentration greater than said third dopant concentration to form a drain region of said RF MOS transistor, said third region contacting said second region;
      a fourth region formed in said semiconductor material, said fourth region being of said first conductivity type and having a fifth dopant concentration to form a body region of said RF MOS transistor, said fifth dopant concentration being at least equal to said first dopant concentration, said fourth region having a first end underlying said conductive gate, any remaining portion of said semiconductor material underlying said gate being of said first conductivity type;

a fifth region formed in said semiconductor material, said fifth region being of said second conductivity type and having a sixth dopant concentration to form a source region of said RF MOS transistor, said fifth region being located within said fourth region;

a sixth region formed in said semiconductor-material, said sixth region being of said first conductivity type and having a seventh dopant concentration to form a body contact region of said RF MOS transistor, said seventh dopant concentration being greater than said fifth dopant concentration of said fourth region, said sixth region contacting said fourth region; and a plug region further comprising:
  a first conductive plug region formed in said semiconductor material; said first conductive plug region contacting said body contact region of said semiconductor material;
  a between-conductive-plug region formed in said semiconductor material, said between-conductive-plug region being of said first conductivity type and having a between-conductive-plug dopant concentration; said between-conductive-plug region contacting said first conductive plug region; and
  a second conductive plug region formed in said semiconductor material; said second conductive plug region contacting said between-conductive-plug region.

34. A semiconductor device, comprising:

a semiconductor substrate of a first conductivity type and having a substrate dopant concentration;

a semiconductor material overlying said substrate, said semiconductor material having a first conductivity type, said semiconductor material having a first dopant concentration and a top surface;

a plurality of transistor disposed upon said top surface of said semiconductor material, at least some of said plurality of transistors having a lateral DMOS structure, including:
  a conductive gate overlying a portion of and insulated from the top surface of said semiconductor material;
  a first region formed completely within said semiconductor material to a first depth level, said first region being of a second conductivity type, and having a second dopant concentration to form a first enhanced drain drift region of said RF MOS transistor;
  a second region formed in said semiconductor material to a second depth level, said second region being of said second conductivity type and having a third dopant concentration to form a second enhanced drain drift region of said RF MOS transistor, said second region contacting said first region, said third dopant concentration being higher than said second dopant concentration;
  a third region formed in said semiconductor material, said third region being of said second conductivity type and having a fourth dopant concentration greater than said third dopant concentration to form a drain region of said RF MOS transistor, said third region contacting said second region;
  a fourth region formed in said semiconductor material, said fourth region being of said first conductivity type and having a fifth dopant concentration to form a body region of said RF MOS transistor, said fifth dopant concentration being at least equal to said first dopant concentration, said fourth region having a first end underlying said conductive gate, any remaining portion of said semiconductor material underlying said gate being of said first conductivity type;
  a fifth region formed in said semiconductor material, said fifth region being of said second conductivity type and having a sixth dopant concentration to form a source region of said RF MOS transistor, said fifth region being located within said fourth region;
  a sixth region formed in said semiconductor material, said sixth region being of said first conductivity type and having a seventh dopant concentration to form a body contact region of said RF MOS transistor, said seventh dopant concentration being greater than said fifth dopant concentration of said fourth region, said sixth region contacting said fourth region; and
  a plug region further comprising:
    a first conductive plug region formed in said semiconductor material; said first conductive plug region contacting said body contact region of said semiconductor material;
    a first between-conductive-plug region formed in said semiconductor material, said first between-conductive-plug region being of said first conductivity type and having a first between-conductive-plug dopant concentration; said first between-conductive-plug region contacting said first conductive plug region; and
    a second conductive plug region formed in said semiconductor material; said second conductive plug region contacting said first between-conductive-plug region; and
    a second between-conductive-plug region formed in said semiconductive material, said second between-conductive-plug region being of said first conductivity type and having a second between-conductive-plug dopant concentration; said second between-conductive-plug region contacting said second conductive plug region.

* * * * *